(12) United States Patent
Lin et al.

(10) Patent No.: US 8,241,978 B2
(45) Date of Patent: Aug. 14, 2012

(54) METHOD OF MANUFACTURING SEMICONDUCTOR DEVICE HAVING INTEGRATED MOSFET AND SCHOTTKY DIODE

(75) Inventors: Wei-Chieh Lin, Hsinchu (TW); Li-Cheng Lin, Taipei (TW); Hsin-Yu Hsu, Chiayi County (TW); Ho-Tai Chen, Taipei County (TW); Jen-Hao Yeh, Kaohsiung County (TW); Guo-Liang Yang, Hsinchu (TW); Chia-Hui Chen, Taichung County (TW); Shih-Chieh Hung, Changhua County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 39 days.

(21) Appl. No.: 12/536,504

(22) Filed: Aug. 6, 2009

(65) Prior Publication Data
US 2010/0289075 A1 Nov. 18, 2010

(30) Foreign Application Priority Data
May 13, 2009 (TW) .............................. 98115824 A

(51) Int. Cl.
*H01L 27/06* (2006.01)
*H01L 21/336* (2006.01)
(52) U.S. Cl. .................. 438/237; 257/334; 257/E21.41; 257/E21.598; 257/E27.016; 257/E29.262; 438/270

(58) Field of Classification Search .................. 257/334, 257/E21.41, E21.575, E21.598, E21.616, 257/E27.016, E29.262; 438/237, 270
See application file for complete search history.

(56) References Cited

U.S. PATENT DOCUMENTS

| | | | |
|---|---|---|---|
| 6,049,108 A | 4/2000 | Williams et al. | |
| 6,351,018 B1 | 2/2002 | Sapp | |
| 6,486,524 B1 | 11/2002 | Ahmed | |
| 6,498,108 B2 | 12/2002 | Cao et al. | |
| 2008/0315303 A1* | 12/2008 | Vannucci et al. | 257/334 |
| 2009/0315106 A1* | 12/2009 | Hsieh | 257/334 |
| 2009/0315107 A1* | 12/2009 | Hsieh | 257/334 |

* cited by examiner

*Primary Examiner* — Lynne Gurley
*Assistant Examiner* — Vernon P Webb
(74) *Attorney, Agent, or Firm* — Winston Hsu; Scott Margo

(57) ABSTRACT

A semiconductor device having integrated MOSFET and Schottky diode includes a substrate having a MOSFET region and a Schottky diode region defined thereon; a plurality of first trenches formed in the MOSFET region; and a plurality of second trenches formed in the Schottky diode region. The first trenches respectively including a first insulating layer formed over the sidewalls and bottom of the first trench and a first conductive layer filling the first trench serve as a trenched gate of the trench MOSFET. The second trenches respectively include a second insulating layer formed over the sidewalls and bottom of the second trench and a second conductive layer filling the second trench. A depth and a width of the second trenches are larger than that of the first trenches; and a thickness of the second insulating layer is larger than that of the first insulating layer.

12 Claims, 12 Drawing Sheets

US 8,241,978 B2

METHOD OF MANUFACTURING SEMICONDUCTOR DEVICE HAVING INTEGRATED MOSFET AND SCHOTTKY DIODE

BACKGROUND OF THE INVENTION

1. Field of the Invention

This present invention is related to a semiconductor device having integrated metal-oxide-semiconductor field-effect transistor (MOSFET) and Schottky diode and manufacturing method thereof, and more particularly, to a semiconductor device having integrated trench MOS barrier Schottky (TMBS) and manufacturing method thereof.

2. Description of the Prior Art

A Schottky diode is constructed by a metal-to-semiconductor interface where this interface is known to have rectifying characteristics as a PN-junction diode. Moreover, Schottky diode provides rectification as a result of unipolar current transport across the metal-semiconductor contact. Consequently, the Schottky diode has advantage of lower threshold voltage and faster response speed when switching between forward and reverse bias voltage over the PN-junction diode. Thus Schottky diode is widely used in power converter for reducing power consumption and improving switching speed. For instance, a semiconductor device having integrated MOSFET and Schottky diode achieves the goal of reducing power consumption by adopting advantages of Schottky diode such as lower forward voltage (Vf) than that of the body diode of a MOSFET, superior reverse recovery, and faster dynamic response time.

Conventionally, the MOSFET of the conventional power converter is electrically connected in parallel with an external Schottky diode. But it suffers higher production cost and unavoidable parasitic inductances generated when electrically connecting the external Schottky diode to the MOSFET. Therefore, semiconductor device having integrated trench MOSFET and Schottky diode, namely TMBS, is developed. Please refer to FIG. 1, which is a schematic drawing of a conventional TMBS device. As shown in FIG. 1, the conventional TMBS device includes an N-type substrate 100 having an epitaxial silicon layer 102 and a plurality of trenches 104a, 104b formed thereon. The trenches 104a, 104b have the same depth and width. The TMBS device also includes at least a MOSFET 110 and a Schottky diode 120 positioned on the substrate 100. The MOSFET 110 includes a trenched gate 110 formed in the trench 104a, and an N-type heavily doped source 118. The trenched gate 116 is constructed by a thin dielectric layer 112 and a conductive layer 114 filling the trenches 104a. The Schottky diode 120 includes the same dielectric layer 112, the same conductive layer 114 filling the trench 104b, and a metal layer 122, which contacts the substrate 100 between the trenches 104b, serving as an anode of the Schottky diode 120. A surface of the substrate opposite to the surface having the MOSFET 110 and the Schottky diode 120 has a metal layer 106 formed thereon. The metal layer 106 serves as a drain of the MOSFET 110 and a cathode of the Schottky diode 120.

Although TMBS achieves integration of the MOSFET 110 and the Schottky diode 120, it is getting more and more complicated and strict to form the thin dielectric layer 112 and the conductive layer 114 in the trenches 104a, 104b on a demand for higher density, higher efficiency and higher voltage tolerance. Same consideration also emerges when integrating TMBS with other high-density process such as tungsten process. Therefore, a TMBS and manufacturing method thereof that is able to satisfy said demands is still in need.

SUMMARY OF THE INVENTION

The present invention therefore provides a TMBS and manufacturing method thereof to satisfy device demands for higher density, higher efficiency and higher voltage tolerance.

According to the claimed invention, the present invention provides a method of manufacturing semiconductor device having integrated MOSFET and Schottky diode. The method comprises steps of:

providing a semiconductor substrate having a first dopant type, the semiconductor substrate including a first surface and an opposite second surface, and the first surface having a MOSFET region and a Schottky diode region defined thereon;

forming a plurality of first trenches in the MOSFET region, a plurality of second trenches and a plurality of mesas defined by the second trenches in the Schottky diode region in the first surface, a depth and a width of the second trenches are larger than a depth and a width of the first trenches;

forming a first insulating layer covering bottoms and sidewalls of the first trenches and the second trenches on the first surface;

forming a first conductive layer filling the first trenches on the first surface;

removing the first conductive layer formed on the first surface and in the second trenches to form at least a trenched gate in the MOSFET region;

forming a second insulating layer covering the bottom and sidewalls of the second trenches on the first surface, a thickness of the second insulating layer is larger than a thickness of the first insulating layer;

forming a second conductive layer filling the second trenches on the first surface;

forming an inter-layer dielectric (ILD) layer on the first surface;

forming at least a source opening in the ILD layer and the semiconductor substrate in the MOSFET region;

forming a first contact plug in the source opening; and forming a first metal layer on the first surface of the semiconductor substrate, the first metal layer being electrically connected to the first contact plug.

According to the claimed invention, the present invention further provides a semiconductor device having integrated MOSFET and Schottky diode. The semiconductor device comprises:

a semiconductor substrate having a first and a second surface opposite to the first surface, the first surface having a MOSFET region and a Schottky diode region defined thereon;

a plurality of first trenches formed in the MOSFET region in the first surface;

a first insulating layer covering a bottom and sidewalls of the first trenches;

a first conductive layer filling the first trenches and to form at least a trenched gate of a MOSFET;

a plurality of second trenches and a plurality of mesas defined by the second trenches formed in the Schottky diode region in the first surface, a width and a depth of the second trenches are larger than a width and a depth of the first trenches;

a second insulating layer covering a bottom and sidewalls of the second trenches, a thickness of the second insulating layer is larger than a thickness of the first insulating layer;

a second conductive layer filling the second trenches;

a first metal layer formed on the first surface of the semiconductor substrate; and a plurality of first contact plugs formed in the MOSFET region in the first surface, the first contact plugs being electrically connected to the first metal layer.

The present invention provides a semiconductor device having trench MOSFET and Schottky diode integrated in a semiconductor substrate, therefore device density is increased while the voltage bearing ability of the Schottky diode is improved by the thicker dielectric layer of the Schottky diode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
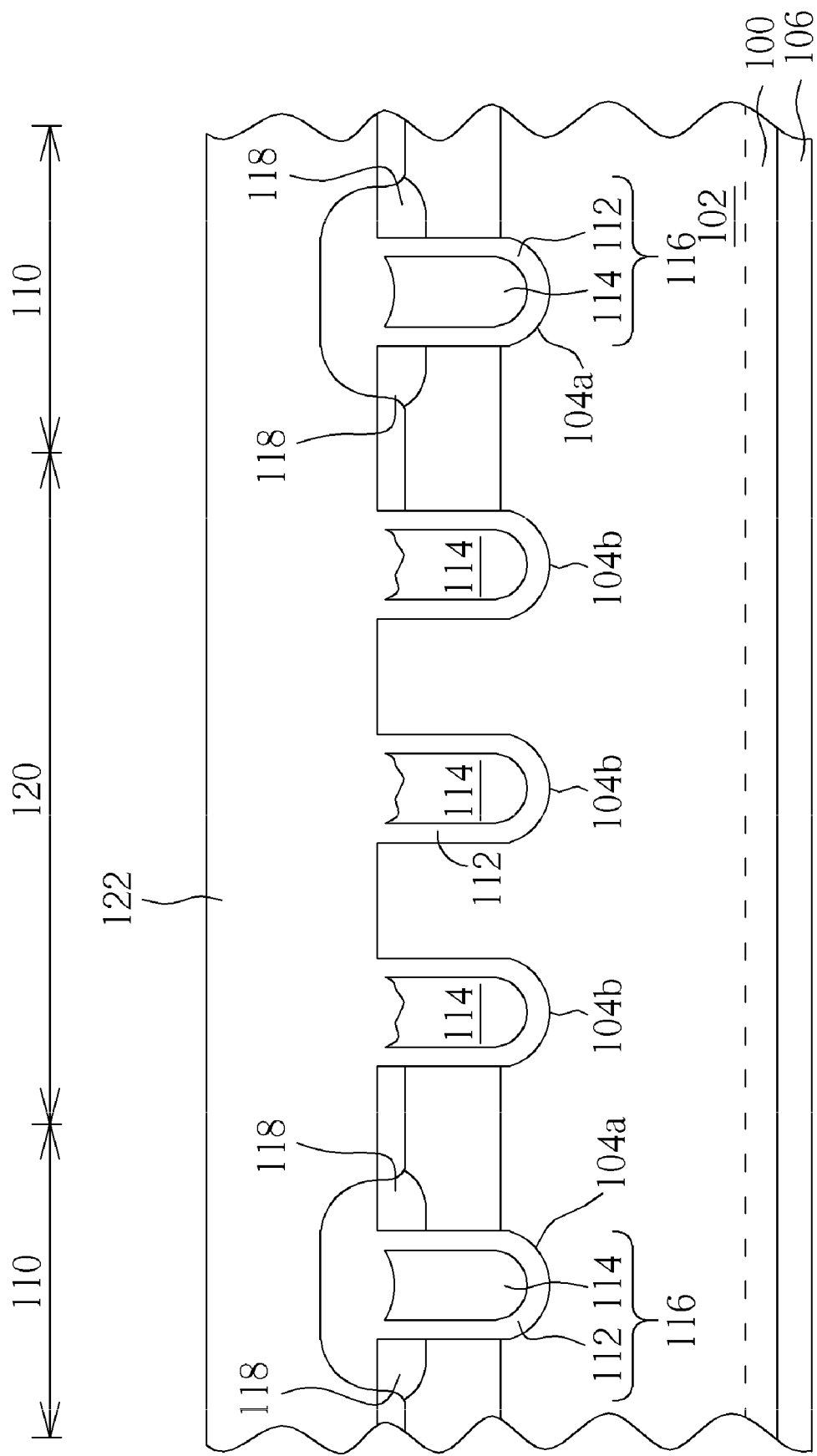
FIG. 1 is a schematic drawing of a conventional TMBS device.
Figure 2:
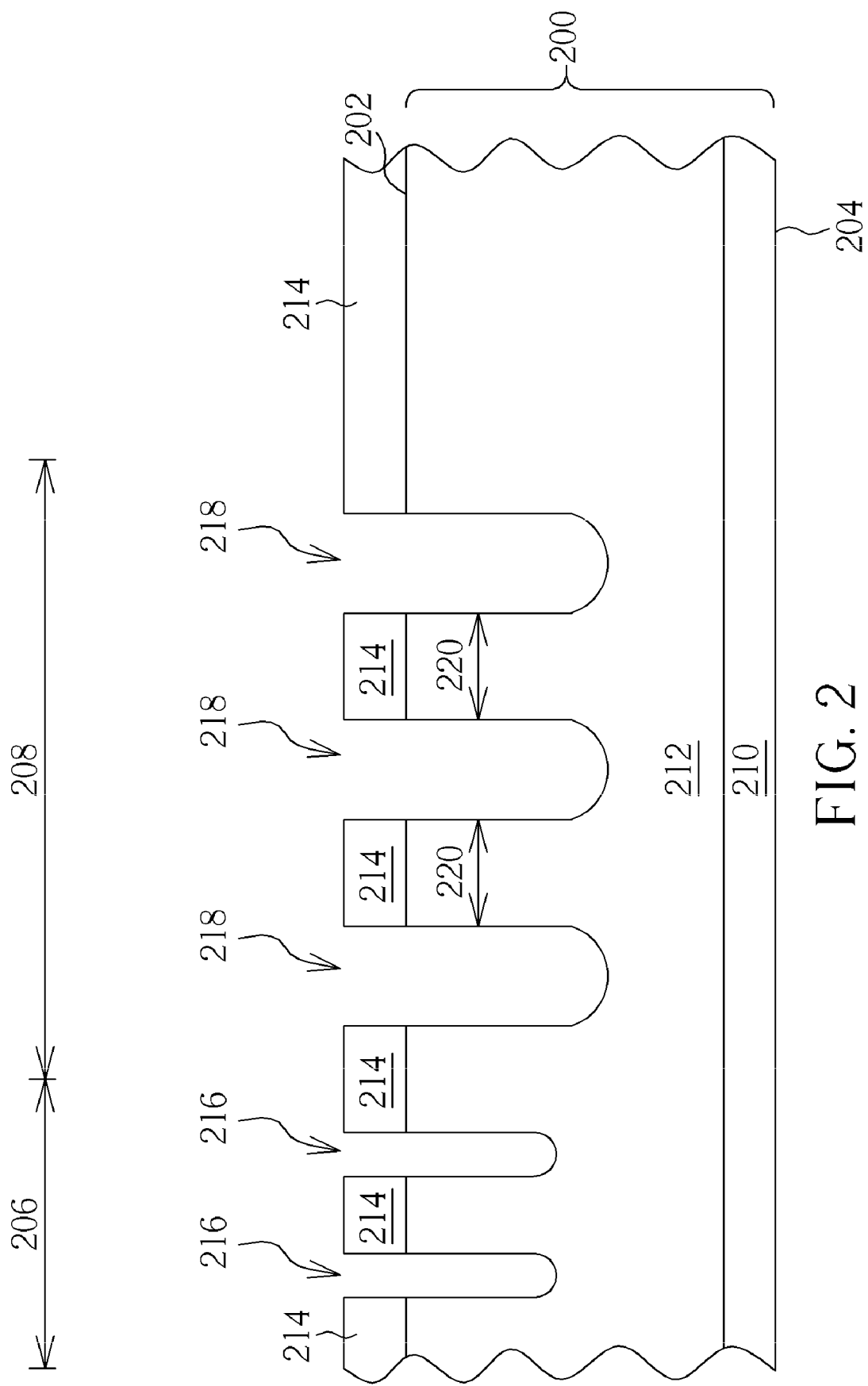
FIGS. 2-10 are schematic drawings illustrating a method of manufacturing a semiconductor device having integrated MOSFET and Schottky diode provided by a first preferred embodiment of the present invention.

Please refer to FIGS. 2-10, which are schematic drawings illustrating a method of manufacturing a semiconductor device having integrated MOSFET and Schottky diode provided by a first preferred embodiment of the present invention. As shown in FIG. 2, a semiconductor substrate 200 is provided, the semiconductor substrate 200 includes a first surface 202 and a second surface 204 opposite to the first surface 202. The first surface 202 further includes a MOSFET region 206 and a Schottky diode region 208 defined thereon. The semiconductor substrate 200 comprises a silicon substrate 210 and an epitaxial silicon layer 212 formed over the silicon substrate 210. Both of the silicon substrate 210 and the epitaxial silicon layer 212 comprises a first dopant type. In the first preferred embodiment, the first dopant type is N-type. The silicon substrate 210 is heavily doped. In other words, a doped concentration of the silicon substrate 210 is higher than a doped concentration of the epitaxial silicon layer 212. Basically, the thicker the epitaxial silicon layer 212 is, the better voltage bearing ability it has. Therefore the thickness of the epitaxial silicon layer 212 may be modified depending on the requirement for voltage bearing ability, and thus the voltage bearing ability of the Schottky diode is consequently modified. However, the thickness of the epitaxial silicon layer 212 also affects the properties of the Schottky diode. As a result, the thickness of the epitaxial silicon layer 212 is adjusted according to the requirements to voltage bearing ability and the properties of the Schottky diode. Additionally, the material of the semiconductor substrate 200 is not limited to the silicon substrate disclosed above, and the semiconductor substrate 200 may be a single-layered structure or a multi-layered structure made of other suitable semiconductor materials.

Please still refer to FIG. 2, a patterned photoresist layer 214 is formed on the first surface 202 of the semiconductor substrate 200 and followed by performing a first etching process to etch the semiconductor substrate 200 not covered by the patterned photoresist layer 214. Consequently, a plurality of first trenches 216 are formed in the MOSFET region 206 and a plurality of second trenches 218 are formed in the Schottky diode region 208 in the first surface 202. Furthermore, a plurality of mesas 220 defined by the second trenches 218 are simultaneously formed as shown in FIG. 2. A width of the mesa 220 is about 0.2-1.2 µm. It is noteworthy that a width of the second trenches 218 is larger than that of the first trenches 216. In the first preferred embodiment, the width of the second trenches 218 is exemplarily 3-5 times to the width of the first trenches 216. Due to the loading effect, higher etching rate occurs at the wider second trenches 218. Accordingly, the second trenches 218 possess larger depth and width than that of the first trenches 216 after the first etching process.

Figure 3:
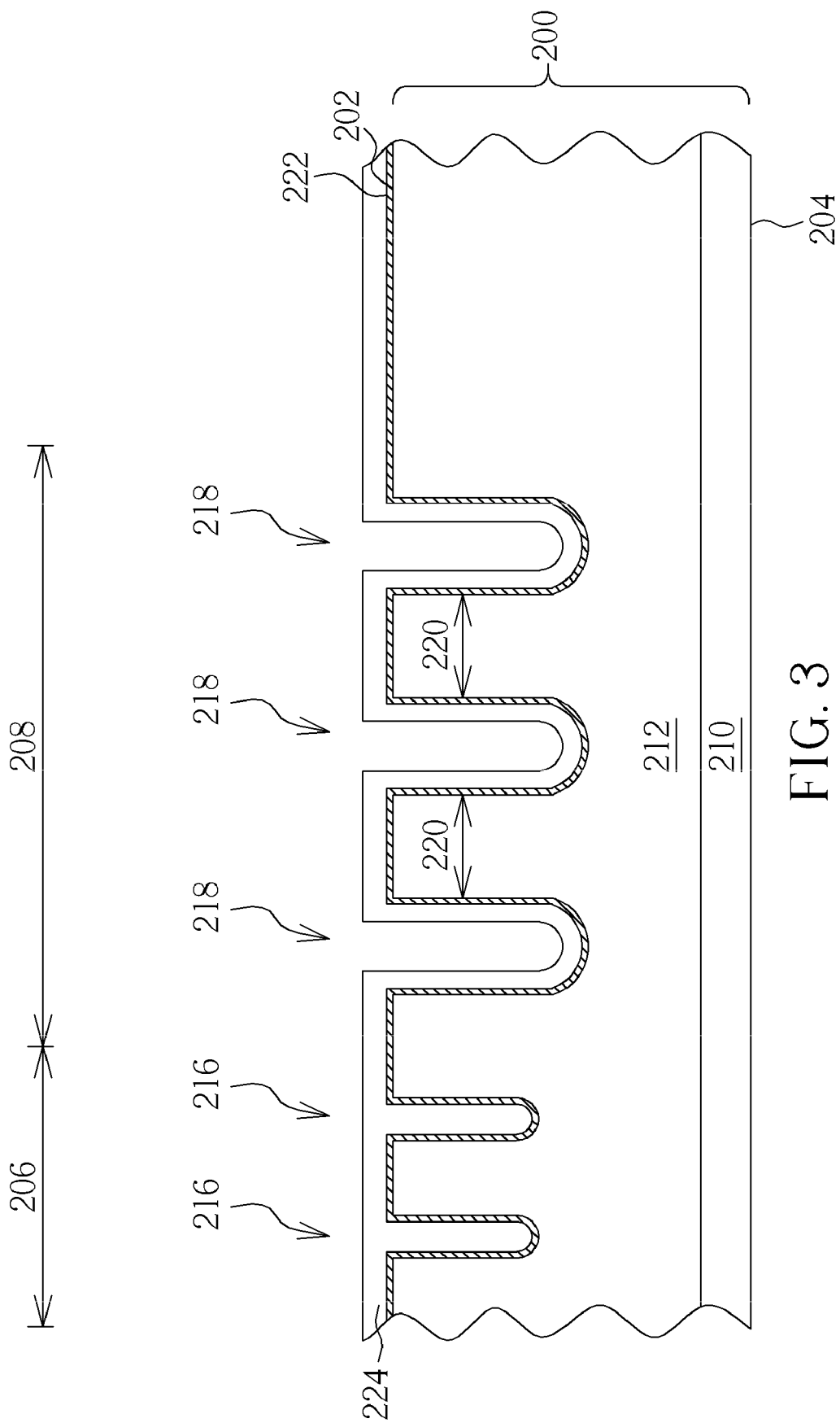

Please refer to FIG. 3. After removing the patterned photoresist layer 214, a first insulating layer 222 is formed covering bottoms and sidewalls of the first trenches 216 and the second trenches 208 on the first surface 202. A thickness of the first insulating layer 222 is about 250-1000 angstroms. Serving as a gate dielectric layer of the trench MOSFET, the first insulating layer 222 can comprise silicon oxide or other dielectric materials. Next, a first conductive layer 224 filling the first trenches 216 and covering the bottom and sidewalls of the second trenches 218 is formed on the first surface 202. The first conductive layer 224 can be a doped semiconductor layer, but not limited to this.

Figure 4:
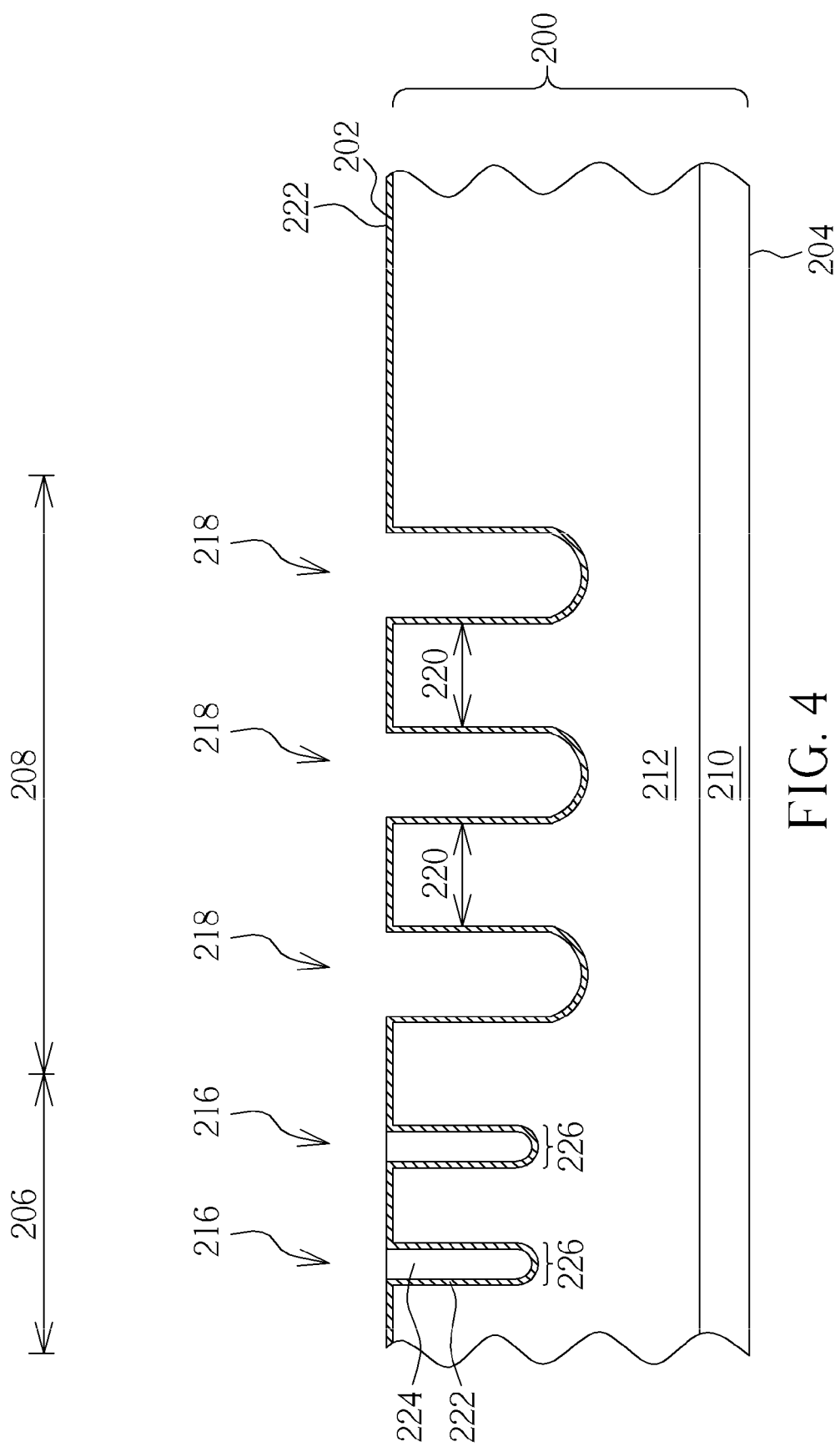

Please refer to FIG. 4. Then, a second etching process, exemplarily is an isotropic etching such as a dry etching, is performed to remove the first conductive layer 224 in the second trenches 218 and covering the first surface 202. Thus at least a trenched gate 226 is formed in the MOSFET region 206.

Figure 5:
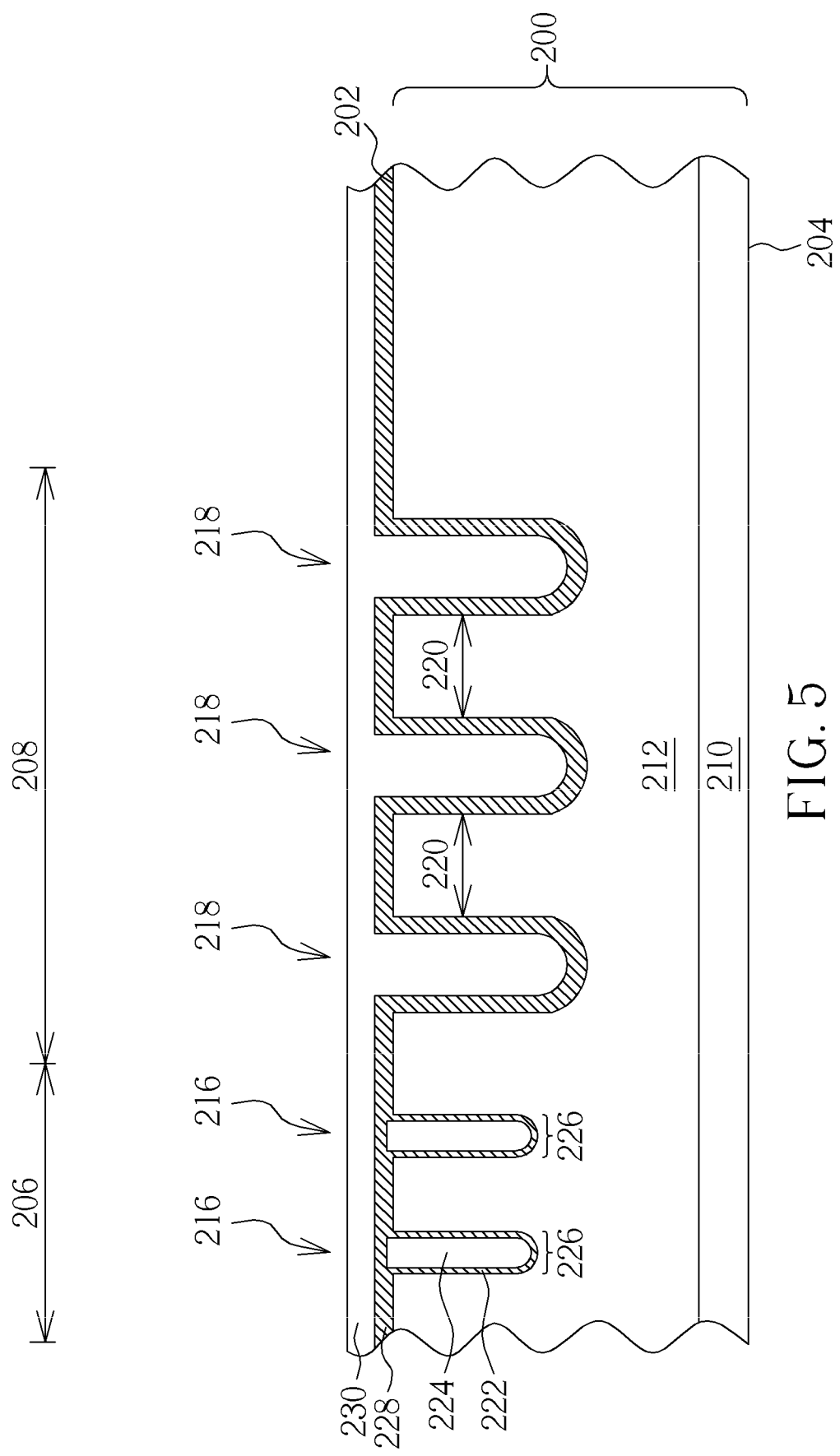

Please refer to FIG. 5. A second insulating layer 228 covering the bottoms and sidewalls of second trenches 218 is then formed on the first surface 202. It is noteworthy that a thickness of the second insulating layer 228 is larger than that of the first insulating layer 224. In the first preferred embodiment, the thickness of the second insulating layer 228 is about 2500-5000 angstroms. After forming the second insulating layer 228, a second conductive layer 230 filling the second trenches 218 is formed on the first surface 202. The second insulating layer 228 and the second conductive layer 230 can comprises same materials respectively with the first insulating layer 222 and the first conductive layer 224, but not limited to this.

Figure 6:
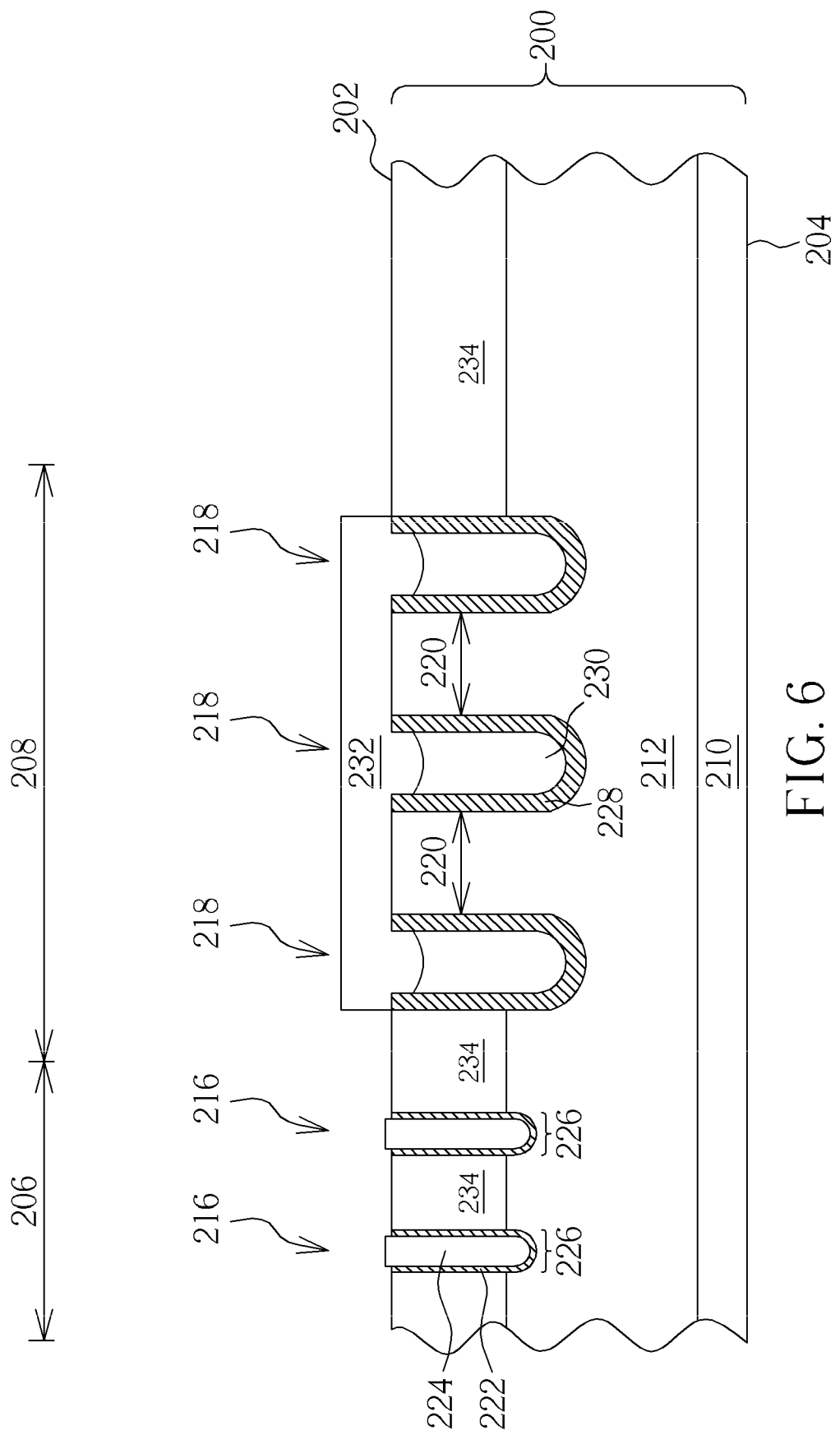

Please refer to FIG. 6. A third etching process, preferably an anisotropic etching process, is performed to remove portions of the second conductive layer 230 and the second insulating layer 228. Then, a patterned photoresist layer 232 covering the first surface 202 in the Schottky diode region 208 is formed. Thereafter, a doping process is performed to the semiconductor substrate 200 not covered by the patterned photoresist layer 232. Thus at least a doped body 234 is formed in the MOSFET region 206. The doped body 234 is adjacent to the first trenches 216 and comprises a second dopant type, which is P-type in this preferred embodiment.

Figure 7:
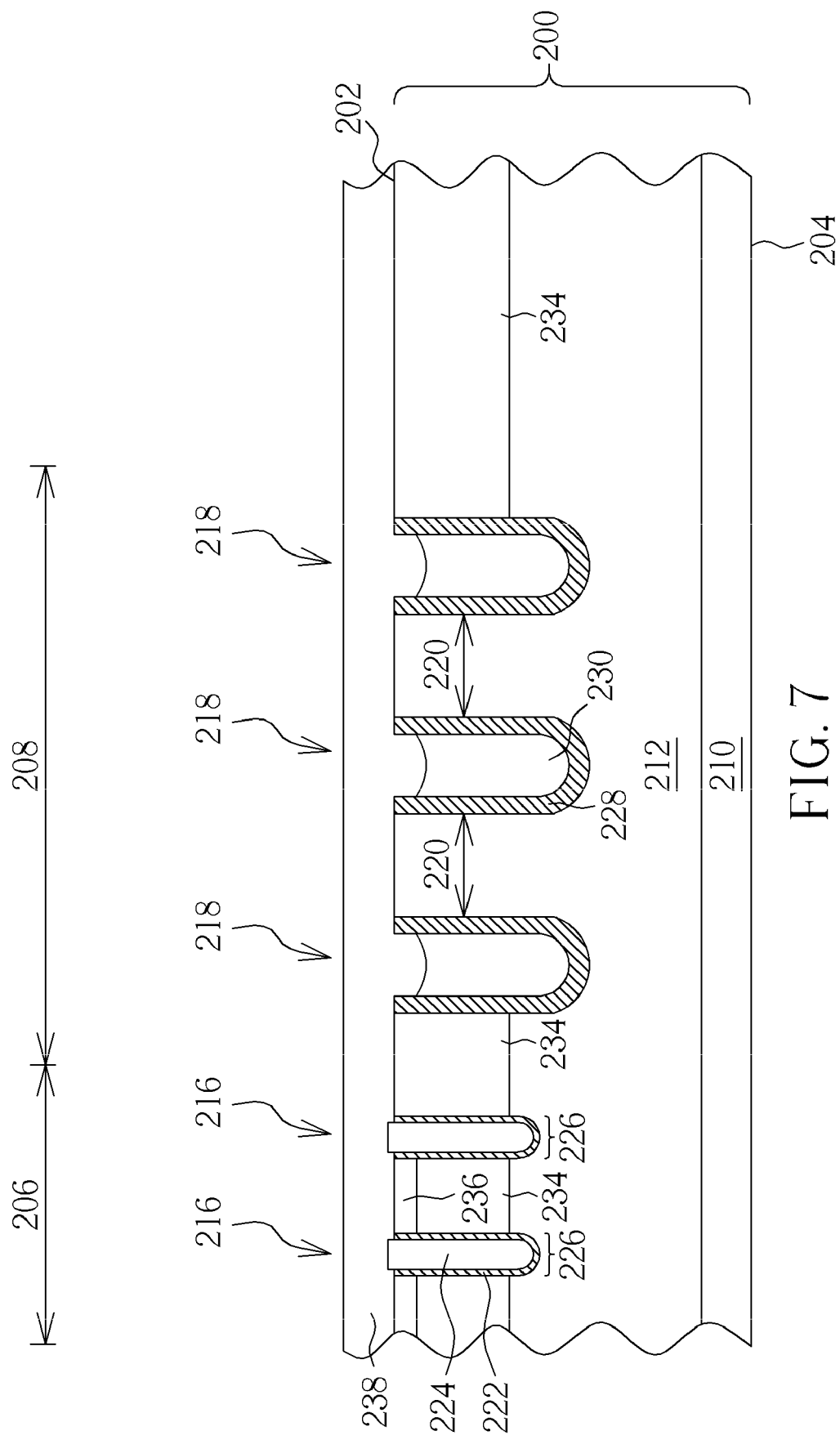

Please refer to FIG. 7. After forming the doped body 234, another doping process is performed to form a source region 236 adjacent to the first trenches 216 and near the first surface 202 in the doped body 234 in the MOSFET region 232. The source region 236 serving as a source of the trench MOSFET comprises the first dopant type, which is the N-type as mentioned above.

Figure 8:
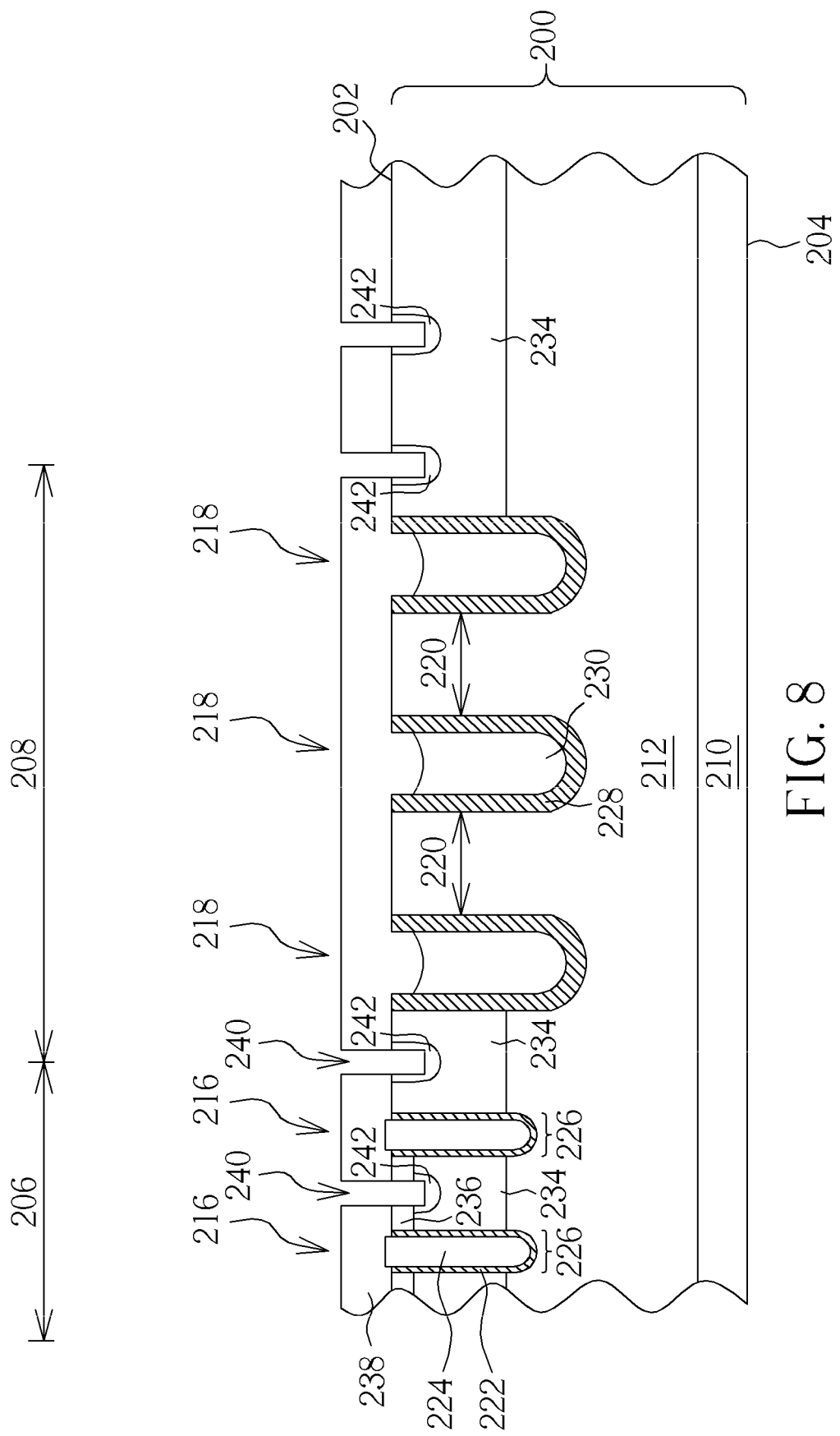

Please refer to FIG. 8. After forming the doped body 234 and the source region 236, an inter-layer dielectric (ILD) layer 238 is entirely formed on the first surface 202 in the MOSFET region 206 and the Schottky diode region 208. The ILD layer comprises borophosphosilicate (BPSG) or other dielectric materials. Then, at least a source opening 240 is formed in the ILD layer 238 and the semiconductor substrate 200 in the MOSFET region 206. The source opening 240 exposes the doped body 234 under the source region 236. The ILD layer 238 is used to be a mask in a doping process that is performed to form a source contact 242 under the source region 236 in the doped body 234 through the source opening 240. The source contact 242 comprises the second dopant type, which is the P-type as mentioned above. Since the ILD layer 238 serves as the mask, no second dopants are to be doped into the semiconductor substrate 200 except the source opening 240. It is well-known to those skilled in the art that a doped concentration of the source region 236 is higher than a doped concentration of the source contact 242, and the doped concentration of the source contact 242 is higher than a doped concentration of the doped body 234.

Figure 9:
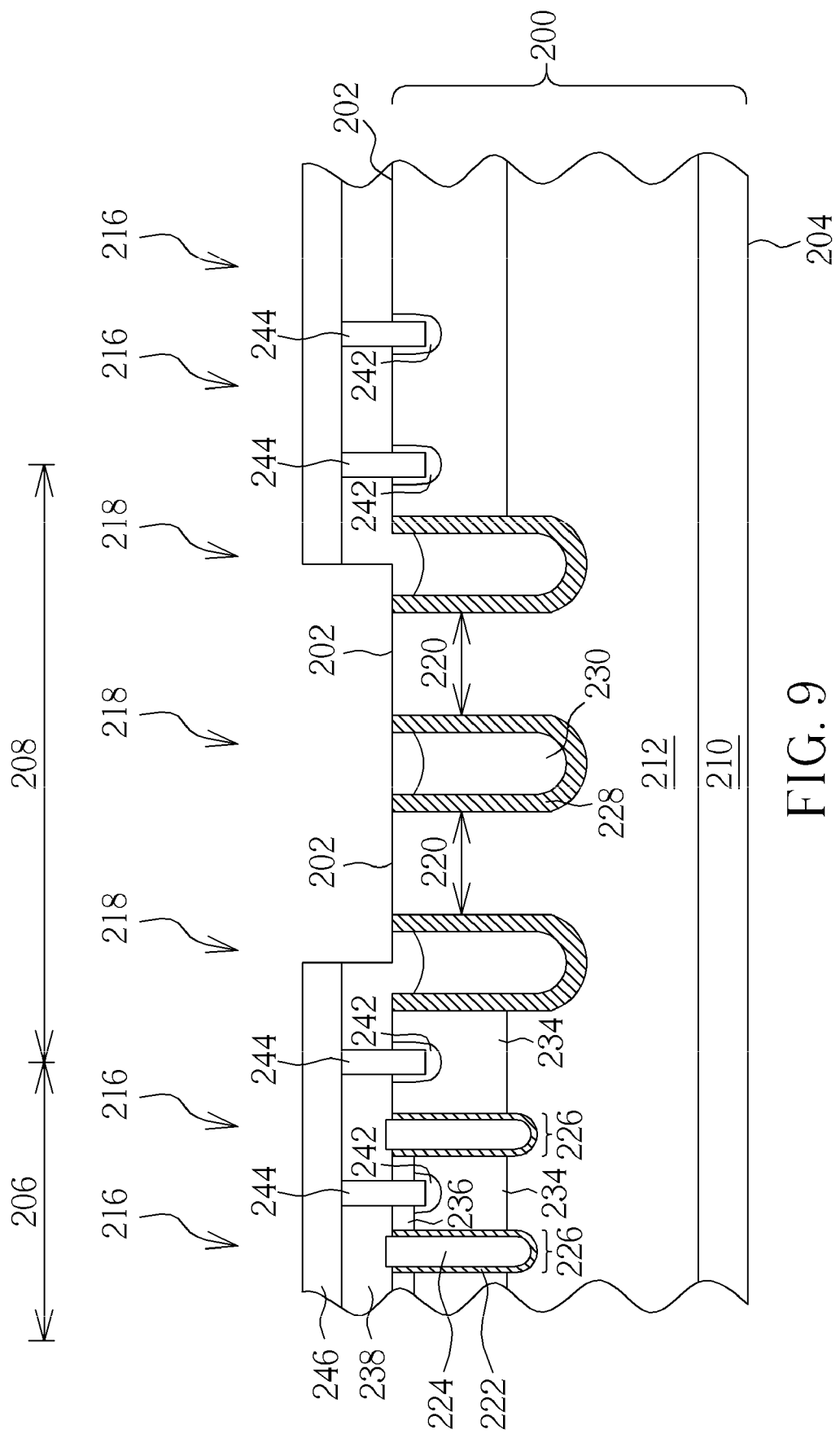

Please refer to FIG. 9. Next, first contact plugs 244 are formed respectively in the source openings 240. The first contact plugs 244 can be formed by a tungsten process. After forming the first contact plugs 244, a patterned photoresist layer 246 covering the MOSFET region 206 is formed on the first surface 202 of the semiconductor substrate 200 and followed by performing a fourth etching process. Consequently, the ILD layer 238 not covered by the patterned photoresist layer 246 in the Schottky diode region 208 is removed. After the fourth etching process, the ILD layer 238 covers the first surface 202 only in the MOSFET region 206, while the mesas 220 in the Schottky diode region 208 are exposed.

Figure 10:
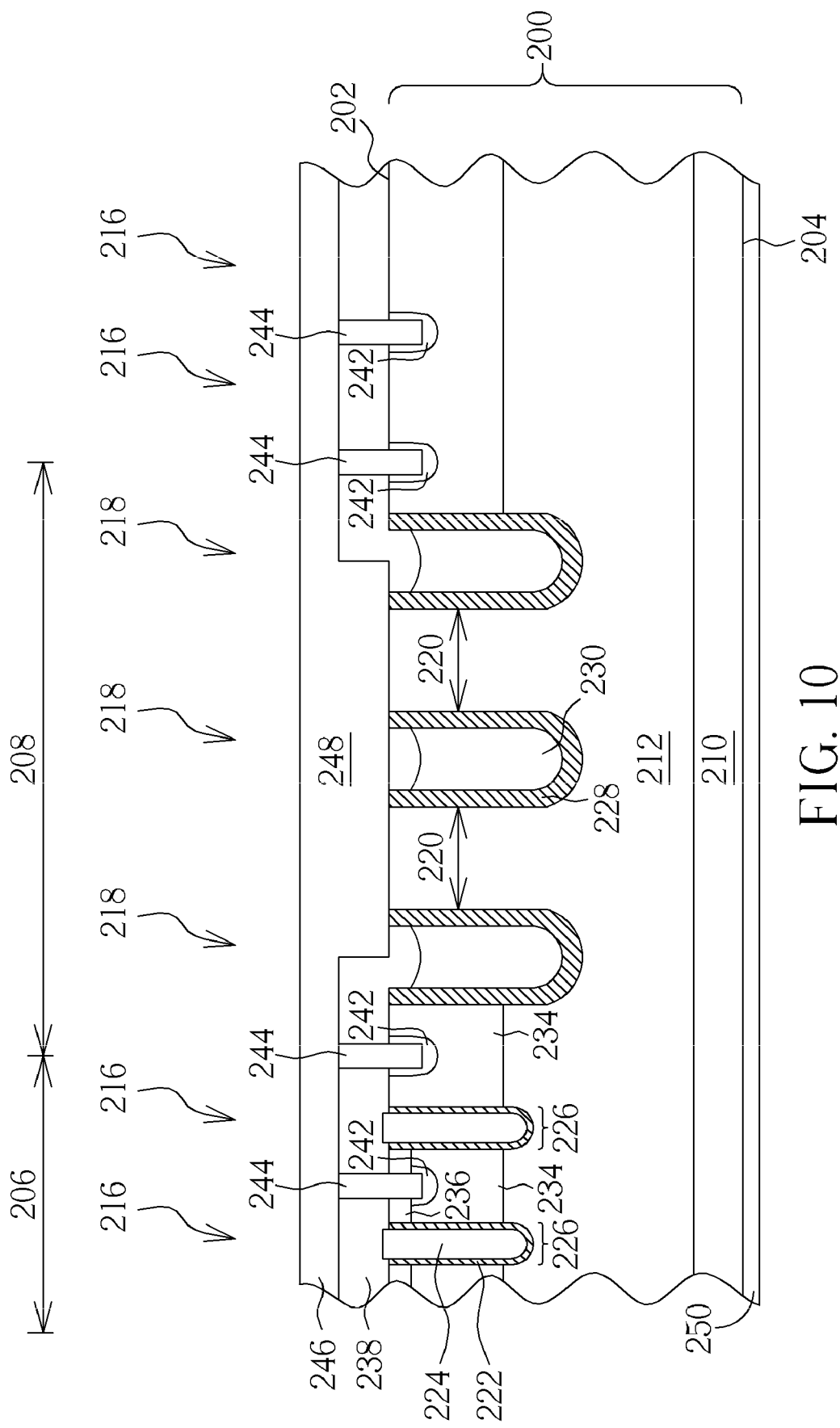

Please refer to FIG. 10. After removing the patterned photoresist layer 246, a first metal layer 248 is formed on the first surface 202 of the semiconductor substrate 200. The metal layer 248 comprises TiN and AlCu, but not limited to this. In the MOSFET region 206, the first metal layer 248 is electrically connected to source contact 242 by the contact plugs 244. In the Schottky diode region 208, the first metal layer 248 contacts the first surface 202 of the mesas 220 and serves as an anode of the Schottky diode. After forming the first metal layer 248, a second metal layer 250 is formed on the second surface 204 of the semiconductor substrate 200. The second metal layer 250 serves as a drain of the trench MOSFET and a cathode of the Schottky diode.

According to the method of manufacturing the semiconductor device having integrated MOSFET and Schottky diode provided by the first preferred embodiment, the first trenches 216 having smaller width are formed in the MOSFET region 206, while the second trenches 218 having larger width are simultaneously formed in the Schottky diode region 208. Therefore the trench MOSFET formed in the MOSFET region 206 satisfy the demand for higher device density. Specially, the second trenches 218 having larger width in the Schottky diode region 208 is able to accommodate the thicker second insulating layer 228, and the thicker second insulating layer 228 improves voltage bearing ability of the Schottky diode. Furthermore, the method provided by the first preferred embodiment is able to be integrated with the tungsten process. Accordingly, the method provided by the first preferred embodiment not only provides semiconductor device having integrated MOSFET and Schottky diode satisfying the demand for higher device density, higher power efficiency and higher voltage bearing ability, but also is easily intergraded with other high-density processes.

Figure 11:
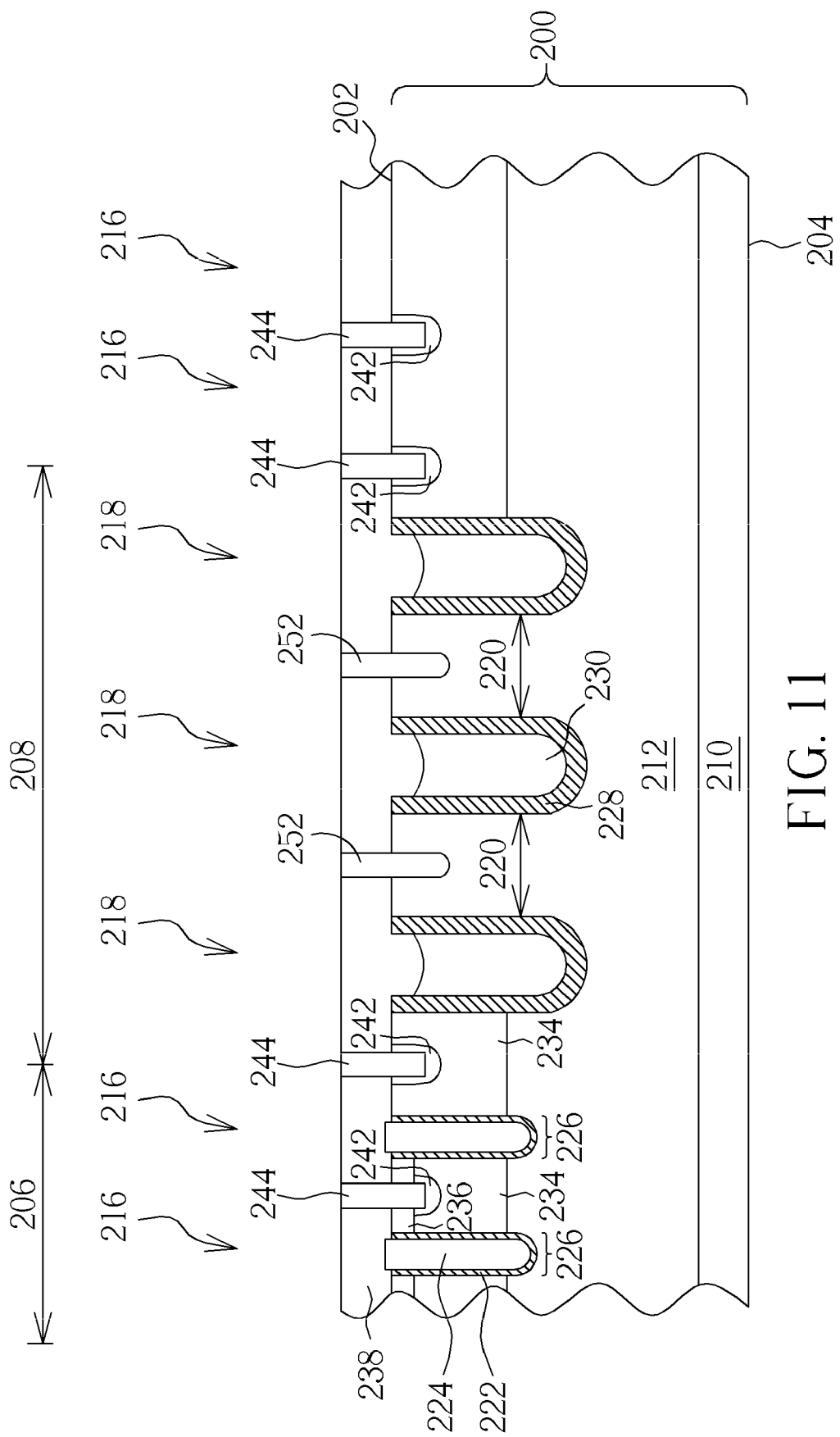
FIGS. 11-12 are schematic drawings illustrating a method of manufacturing a semiconductor device having integrated MOSFET and Schottky diode provided by a second referred embodiment of the present invention.
Figure 12:
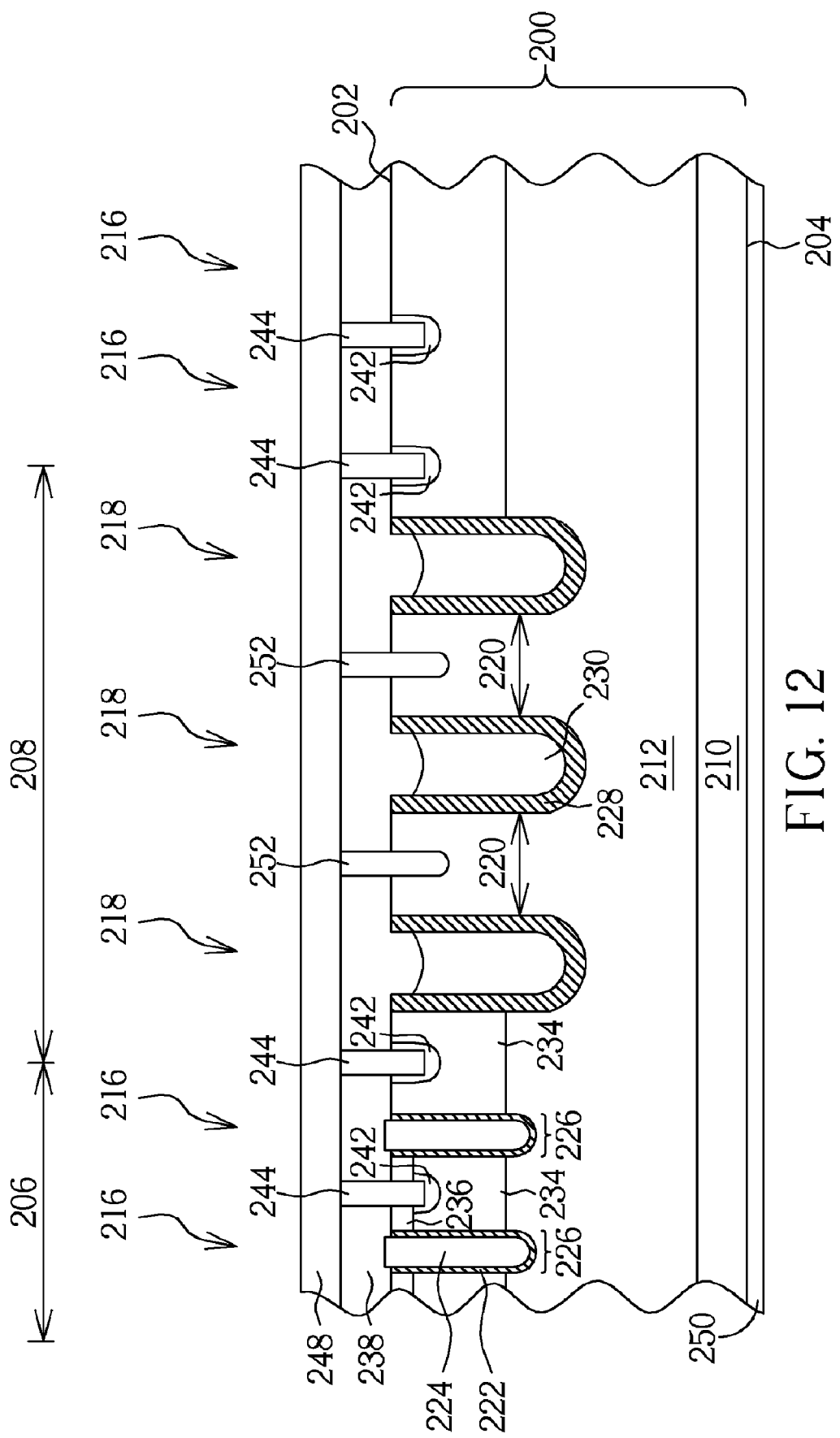

Please refer to FIGS. 11-12, which are schematic drawings illustrating a method of manufacturing a semiconductor device having integrated MOSFET and Schottky diode provided by a second preferred embodiment of the present invention. Because some steps provided by the second preferred embodiment are similar with those provided by the first preferred embodiment, said details are illustrated in FIGS. 2-8 and thus omitted in the interest of brevity. In addition, same elements in the first preferred embodiment and the second preferred embodiment are depicted by the same numerals.

Please refer to FIG. 11. After forming the source contact 242 in the doped body 234, a tungsten process is performed to form a plurality of first contact plugs 244 in the MOSFET region 206. And after forming the first contact plugs 244, another tungsten process is performed to form a plurality of second contact plugs 252 in the ILD layer 238 and the mesas 220 in the Schottky diode region 208. It is noteworthy that the second contact plugs 252 formed in the mesas 220 serve as the anode of the Schottky diode.

Please refer to FIG. 12. After forming the first contact plugs 244 and the second contact plugs 252, a first metal layer 248 is formed on the first surface 202 of the semiconductor substrate 200. The first metal layer 248 is electrically connected to the source contact 242 by the first contact plug 244 and to the mesas 220 by the second contact plugs 252. And a second metal layer 250 is formed on the second surface 204 of the semiconductor substrate 200 after forming the first metal layer 248. The second metal layer 250 serves as a drain of the trench MOSFET and a cathode of the Schottky diode.

The difference between the methods of manufacturing semiconductor device having integrated MOSFET and Schottky diode provided by the first preferred embodiment and the second preferred embodiment is detailed as following: According to the second preferred embodiment, the ILD layer 238 is entirely formed between the first surface 202 and the first metal layer 248. And the first metal layer 248 in the MOSFET region 206 is electrically connected to the source contact 242 by the first contact plugs 244 while the first metal layer 248 in the Schottky diode region 208 is electrically connected to the second contact plugs 252, which serve as the anode of the Schottky diode. Furthermore, because the second contact plugs 252 are formed in the mesas 220, the Schottky contact of the Schottky diode provided by the second preferred embodiment possesses a three-dimensional profile. It is found that a depth of the second contact plug 252 in the mesa 220 determines the Schottky contact, therefore by adjusting the depth of the second contact plug 252 in the mesa 220, the Schottky contact is increased and thus the forward voltage of the Schottky diode is improved.

Accordingly, the present invention provides semiconductor device having trench MOSFET and Schottky diode integrated in a semiconductor substrate. The semiconductor device has the first trenches 216 having smaller width in the MOSFET region 206 and the second trench 218 having larger width in the Schottky diode region 208. Therefore device density is increased by forming the trenched gate 226 in the smaller first trenches 216 in the MOSFET region 206 while the voltage bearing ability of the Schottky diode is improved by forming the thicker dielectric layer in the larger second trenches 218 in the of the Schottky diode region 208. Accordingly, the method provided by the first preferred embodiment not only provides semiconductor device having integrated MOSFET and Schottky diode satisfying the demand for higher device density, higher power efficiency and higher voltage tolerance, but also is easily intergraded with other high-density processes.

Those skilled in the art will readily observe that numerous modifications and alterations of the device and method may be made while retaining the teachings of the invention.

What is claimed is:

1. A method of manufacturing semiconductor device having integrated MOSFET and Schottky diode, comprising steps of:

providing a semiconductor substrate having a first dopant type, the semiconductor substrate including a first surface and an opposite second surface, and the first surface having a MOSFET region and a Schottky diode region defined thereon;

forming a plurality of first trenches in the MOSFET region, a plurality of second trenches and a plurality of mesas defined by the second trenches in the Schottky diode region of the first surface, a depth and a width of the second trenches are larger than a depth and a width of the first trench;

forming a first insulating layer covering bottoms and sidewalls of the first trenches and the second trenches in the first surface;

forming a first conductive layer filling the first trenches in the first surface;

removing the first conductive layer from the first surface and from the second trenches to form a trenched gate in each first trench in the MOSFET region and to expose the first insulating layer in the second trenches in the Schottky diode region;

forming a second insulating layer covering the bottom and sidewalls of the second trenches and the first surface, a thickness of the second insulating layer is larger than a thickness of the first insulating layer;

forming a second conductive layer filling the second trenches on the first surface;

forming an inter-layer dielectric (ILD) layer on the first surface;

forming at least a source opening in the ILD layer and the semiconductor substrate in the MOSFET region;

forming a first contact plug in the source opening; and forming a first metal layer on the first surface of the semiconductor substrate, the first metal layer being electrically connected to the first contact plug.

2. The method of claim 1, wherein the semiconductor substrate comprises a silicon substrate and an epitaxial silicon layer formed thereon, and a doped concentration of the silicon substrate is higher than a doped concentration of the epitaxial silicon layer.

3. The method of claim 1, wherein the thickness of the first insulating layer is about 250-1000 angstroms and the thickness of the second insulating layer is about 2600-5000 angstroms.

4. The method of claim 1 further comprising a step of sequentially forming a doped body and a source region in the first surface of the MOSFET region before forming the ILD layer, and the source region being formed in the doped body.

5. The method of claim 4 further comprising a step of forming a source contact under the source region in the doped body after forming the source opening.

6. The method of claim 5, wherein the doped body comprises a second dopant type, the source region comprises the first dopant type, and the source contact comprises the second dopant type.

7. The method of claim 6, wherein a doped concentration of the source region is higher than a doped concentration of the source contact, and the doped concentration of the source contact is higher than a doped concentration of the doped body.

8. The method of claim 1 further comprising a step of forming a plurality of second contact plugs in the Schottky diode region after forming the first contact plugs, the second contact plugs are electrically connected to the first metal layer and the mesas and serve as an anode of the Schottky diode.

9. The method of claim 8, wherein the second contact plugs are formed by a tungsten process.

10. The method of claim 1 further comprising a step of removing the ILD layer in the Schottky diode region to expose the mesas.

11. The method of claim 10, wherein the first metal layer contacts the mesas and serves as an anode of the Schottky diode.

12. The method of claim 1, wherein the first contact plugs are formed by a tungsten process.

* * * * *